(12) United States Patent
Yukinobu (10) Patent No.: US 7,901,538 B2
(45) Date of Patent: Mar. 8, 2011

(54) TRANSPARENT CONDUCTIVE MULTI-LAYER STRUCTURE, PROCESS FOR ITS MANUFACTURE AND DEVICE MAKING USE OF TRANSPARENT CONDUCTIVE MULTI-LAYER STRUCTURE

(75) Inventor: Masaya Yukinobu, Chiba (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 205 days.

(21) Appl. No.: 12/153,581

(22) Filed: May 21, 2008

(65) Prior Publication Data

US 2008/0271843 A1    Nov. 6, 2008

Related U.S. Application Data (62) Division of application No. 10/576,881, filed as application No. PCT/JP2004/16054 on Oct. 22, 2004, now Pat. No. 7,638,807.

(30) Foreign Application Priority Data

Oct. 28, 2003   (JP) ................. 2003/366835

(51) Int. Cl.
| | |
|---|---|
| B29C 65/02 | (2006.01) |
| B29C 65/52 | (2006.01) |
| B32B 37/12 | (2006.01) |
| B32B 37/15 | (2006.01) |
| B32B 37/30 | (2006.01) |
| B29C 65/72 | (2006.01) |
| C09J 5/02 | (2006.01) |

(52) U.S. Cl. ......... 156/290; 156/237; 156/239; 156/241; 156/307.5; 428/212; 428/690; 428/691; 136/263; 257/750; 313/503; 313/506; 313/498; 313/512

(58) Field of Classification Search .................. 136/263; 257/88, 91, 98, 102, 103, 750; 313/503, 313/506, 498, 512; 156/237, 239, 241, 290, 156/307.3, 307.5; 428/212, 690, 691
See application file for complete search history.

(56) References Cited

U.S. PATENT DOCUMENTS

| | | | | |
|---|---|---|---|---|
| 6,271,543 B1 * | 8/2001 | Ohtani et al. | .................. | 257/72 |
| 6,621,215 B1 * | 9/2003 | Su et al. | ....................... | 313/582 |
| 6,624,571 B1 * | 9/2003 | Toyoyasu et al. | ............. | 313/510 |
| 2003/0062828 A1 * | 4/2003 | Sugimoto et al. | ............ | 313/506 |

FOREIGN PATENT DOCUMENTS

| | | |
|---|---|---|
| JP | 60-231396 | 11/1985 |
| JP | 2-5308 | 1/1990 |
| JP | 2-281237 | 11/1990 |

(Continued)

*Primary Examiner* — Philip C Tucker
*Assistant Examiner* — Sonya Mazumdar
(74) *Attorney, Agent, or Firm* — Kratz, Quintos & Hanson, LLP (57) ABSTRACT

A transparent conductive multi-layer structure having a smooth base material 1, a transparent conductive layer 2 formed on the smooth base material 1 by coating, an auxiliary electrode layer 3 formed in a pattern on the transparent conductive layer 2, and a transparent substrate 5 joined to the transparent conductive layer 2 and auxiliary electrode layer 3 through an adhesive layer 4. On a smooth peeled-off surface of the transparent conductive layer 2 from which the smooth base material 1 has been peeled off, various devices are formed to set up devices such as a dye-sensitized solar cell and an organic electroluminescent device.

6 Claims, 4 Drawing Sheets

FOREIGN PATENT DOCUMENTS

| | | |
|---|---|---|
| JP | 4-237909 | 8/1992 |
| JP | 5-504023 | 6/1993 |
| JP | 10-17690 | 1/1998 |
| JP | 2000-149664 | 5/2000 |
| JP | 2003-16842 | 1/2003 |
| JP | 2003016842 A * | 1/2003 |
| JP | 2003-203683 | 7/2003 |

* cited by examiner

TRANSPARENT CONDUCTIVE MULTI-LAYER STRUCTURE, PROCESS FOR ITS MANUFACTURE AND DEVICE MAKING USE OF TRANSPARENT CONDUCTIVE MULTI-LAYER STRUCTURE

CROSS PREFERENCE TO RELATED APPLICATION

This application is a Divisional Application of prior application Ser. No. 10/576,881 filed on Apr. 21, 2006 now U.S. Pat. No. 7,638,807, which is a 371 national stage application of PCT/JP04/16054, filed on Oct. 22, 2004, which is hereby incorporated by reference.

TECHNICAL FIELD

This invention relates to a transparent conductive multi-layer structure usable in transparent electrode portions of devices such as dye-sensitized solar cells and organic electroluminescent devices, a process for its manufacture, and devices making use of the transparent conductive multi-layer structure.

BACKGROUND ART

In recent years, a dye-sensitized solar cell is proposed by Graetzel et al. (see National Publication No. H05-504023). This dye-sensitized solar cell can be fabricated by a simple process and may be constituted of inexpensive materials. Accordingly, there is a high possibility that it can be obtained at a lower cost than conventional silicon type solar cells, and studies thereon are energetically made toward the achievement of its practical use.

The dye-sensitized solar cell is constituted of a transparent electrode formed on a transparent substrate, an oxide semiconductor electrode formed on the transparent electrode, a dye adsorbed on the oxide semiconductor electrode, an electrolyte, and an opposing electrode. The electrolyte is filled between the dye adsorbed oxide semiconductor electrode and the opposing electrode provided opposingly thereto. Upon irradiation of the dye adsorbed oxide semiconductor electrode with visible light such as sunlight, a potential difference is produced between the oxide semiconductor electrode and the opposing electrode to make electric current flow across both the electrodes.

As the transparent electrode of the dye-sensitized solar cell, commonly used are indium tin oxide (ITO) formed by sputtering or the like and fluoro-tin oxide (FTO) formed by chemical vapor deposition (CVD). Also, the oxide semiconductor electrode is constituted of fine titanium oxide particles, and a ruthenium (Ru)-based dye such as a ruthenium bipyridyl complex is used as the dye. Platinum (Pt), carbon or the like is used in the opposing electrode. As the electrolyte, used is an iodide-based electrolyte prepared by dissolving iodide ($I_2$) or lithium iodide (LiI) in an organic solvent such as acetonitrile, ethylene carbonate, propylene carbonate or polyethylene glycol (PEG).

Now, the above conventional transparent electrode is formed by a physical film forming process such as sputtering or CVD, and has a film surface resistivity of about 10 Ω/square. The transparent electrode having such a degree of film surface resistivity is well usable in a dye-sensitized solar cell having a size of about several millimeters square. However, if the dye-sensitized solar cell is one having a size of 10 cm square or more than that, the electric current is consumed as Joule heat at the transparent electrode portion, and hence this lowers electricity generation efficiency extremely.

Therefore, in order to make the dye-sensitized solar cell have a size large enough to be of practical use, it is necessary to make the transparent electrode have a vastly low film surface resistivity, i.e., at least a film surface resistivity of about 1 Ω/square or less. For this end, the transparent electrode may merely be made to have a large layer thickness to lower its film surface resistivity, for example. In such a case, however, because of the large layer thickness, the transparent electrode has a vastly low light transmittance and also a low electricity generation efficiency, and hence it is not practical to do so.

Figure 1:
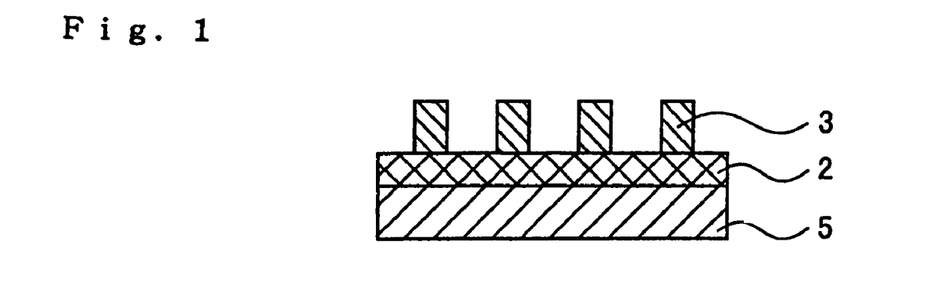
FIG. 1 is a schematic sectional view showing a transparent substrate having an auxiliary electrode layer and a transparent conductive layer in a conventional case.

Accordingly, as shown in FIG. 1, for example an auxiliary electrode layer 3 composed of a metallic component may be formed in a pattern on a transparent electrode layer 2 formed on a transparent substrate 5, to lower the film surface resistivity. Such a method is known in the art. As materials for such an auxiliary electrode layer 3, silver and copper are suitable as having a low resistivity. In the case of the dye-sensitized solar cell, however, the iodide-based electrolyte used as the electrolyte is very highly corrosive, and hence, not to speak of silver and copper, even gold is not usable. Also, in order to prevent this auxiliary electrode layer from corroding, a method is also proposed in which an auxiliary electrode layer on a transparent conductive layer is covered with a protective thin film formed of tin oxide, titanium oxide or the like (see Japanese Patent Application Laid-open No. 2003-203683).

However, such an auxiliary electrode layer must be formed in a layer thickness of several microns to tens of microns (μm) in order for that layer to achieve the intended function, and hence it follows that unevenness (hills and dales) of several microns to tens of microns (μm) in extent comes about on the side where devices are to be formed on the transparent conductive layer. This brings about great restrictions on the formation of devices (e.g., devices must be formed only in areas where any pattern-shaped auxiliary electrode layer is not formed). Also, the upper limit of the thickness of the auxiliary electrode layer depends on the device structure, and is limited to a stated value or less (e.g., 20 μm or less in the case of the dye-sensitized solar cell). Hence, there has also been a limit to how the transparent electrode is made to have a low film surface resistivity. Moreover, in the case when the auxiliary electrode layer is covered with the protective thin film, the thickness of the protective thin film must be controlled to be about 50 nm or less in order to control the protective thin film to have a film surface resistivity of a stated value or less to make electric current flow to the auxiliary electrode layer though the protective thin film. Hence, it has been difficult to achieve a sufficient protective effect without making devices have poor characteristics.

Besides such a dye-sensitized solar cell, as a device required to have a low-resistance transparent electrode, an organic electroluminescent device (hereinafter "organic EL device) is available which is considered promising for its use in display, illumination and so forth. The organic EL device is a self-light-emitting device comprising an ITO or the like transparent electrode and multi-layered thereon a hole injection layer, a polymer light-emitting layer, a cathode layer and so forth. It is not a voltage drive type device such as a liquid-crystal device, but a current drive type devices, and hence, in order to make the device have a large size, it is essential to make its transparent electrode have a vastly low film surface resistivity.

Accordingly, like the above dye-sensitized solar cell, a method is available in which an auxiliary electrode layer is formed in a pattern on the transparent electrode layer to lower the film surface resistivity. In this case as well, however, like the case of the dye-sensitized solar cell, there has been a problem that the unevenness due to the formation of such an auxiliary electrode layer brings about great restrictions in regard to the fabrication of devices.

Moreover, conventional transparent conductive layers used in the dye-sensitized solar cell and organic EL device are formed by film forming processes such as sputtering and CVD, which require large-size and expensive systems. Hence, there have been problems that a very high cost results and besides it is difficult to form transparent conductive layers on transparent substrates having a poor heat resistance, such as plastic films.

Incidentally, in place of the transparent conductive layer forming methods such as sputtering and CVD, a method (coating method) is also proposed in which a plastic film is coated thereon with a transparent conductive layer forming coating fluid containing fine ITO particles dispersed therein, to form a transparent conductive layer. However, the transparent conductive layer thus obtained has so high a film surface resistivity that it can not be said to be practical for its use in the devices such as the dye-sensitized solar cell. As a method by which the transparent conductive layer obtained by this coating method is improved in conductive properties, a method is further proposed in which the film is coated thereon with the transparent conductive layer forming coating fluid, followed by drying and thereafter rolling by means of steel rolls or the like (see Japanese Patent Application Laid-open No. H04-237909). However, the transparent conductive layer obtained has a film surface resistivity of about hundreds of Ω/square, which is still insufficient.

DISCLOSURE OF THE INVENTION

The present invention has been made taking account of the circumstances in such conventional cases. Accordingly, an object of the present invention is to proved a transparent conductive multi-layer structure which can be formed by a low-temperature film formable coating method, and has a transparent conductive layer and an auxiliary electrode layer, which transparent conductive layer has a smooth surface and also a very low film surface resistivity; a process for manufacturing the transparent conductive multi-layer structure; and low-cost devices in which the transparent conductive multi-layer structure is used.

To achieve the above object, the transparent conductive multi-layer structure the present invention provides is characterized by having a smooth base material, a transparent conductive layer formed on the smooth base material by coating, an auxiliary electrode layer formed in a pattern on the transparent conductive layer, and a transparent substrate joined to the transparent conductive layer and auxiliary electrode layer through an adhesive layer; the smooth base material being peelable from the transparent conductive layer.

The transparent conductive multi-layer structure manufacturing process the present invention also provides is characterized by:

coating a smooth base material thereon with a transparent conductive layer forming coating fluid prepared by dispersing conductive fine oxide particles in a solvent, followed by drying to form a transparent conductive layer; a base material peelable from the transparent conductive layer being used as the smooth base material;

forming an auxiliary electrode layer in a pattern on the transparent conductive layer; and joining with an adhesive a transparent substrate to the auxiliary electrode layer formed and to the transparent conductive layer at its areas standing not covered with the auxiliary electrode layer.

The device the present invention further provides is characterized by being incorporated with the transparent conductive multi-layer structure described above, from which the smooth base material has been peeled off to have the transparent conductive layer and the auxiliary electrode layer which are joined to the transparent substrate through the adhesive layer.

Thus, according to the transparent conductive multi-layer structure of the present invention, a transfer process is applied, where the transparent conductive layer and the auxiliary electrode layer which have been formed on the smooth base material by coating are joined to the transparent substrate through the adhesive layer, and the smooth base material is removable by peeling. Hence, the peeled-off surface (base material peeled-off surface) of the transparent conductive layer from which the smooth base material has been peeled off can sufficiently be smooth, and also the transparent conductive layer shows a very good conductivity because it has the auxiliary electrode layer. Accordingly, devices can be formed on the smooth surface (peeled-off surface) without any restrictions at all. Furthermore, the transparent conductive layer and the auxiliary electrode layer are formed by a low-temperature film formable method, e.g., by coating, and hence this enables use of transparent substrates having a poor heat resistance, such as plastic films.

The device in which the transparent conductive multi-layer structure of the present invention is used, as exemplified by the dye-sensitized solar cell and the organic EL device, a very low film surface resistivity is achievable in virtue of the combination of the transparent conductive layer and the auxiliary electrode layer. Also, the auxiliary electrode layer is positioned between the transparent conductive layer and the transparent substrate, and the surface of the transparent conductive layer on its side where devices are to be formed can be very smooth to have no unevenness or protrusions present thereon. Hence, any electrical short circuit by no means occur between device electrodes. Thus, a dye-sensitized solar cell and an organic EL device can be provided which have transparent electrode layers having a very low film surface resistivity, can enjoy a low cost and can be of large area. Especially when used in the dye-sensitized solar cell, the auxiliary electrode can be prevented from corroding, because the auxiliary electrode is positioned on the side opposite to the electrolyte, interposing the transparent conductive layer.

BEST MODES FOR PRACTICING THE INVENTION

The present invention is described below in detail with reference to the drawings.

Figure 2:
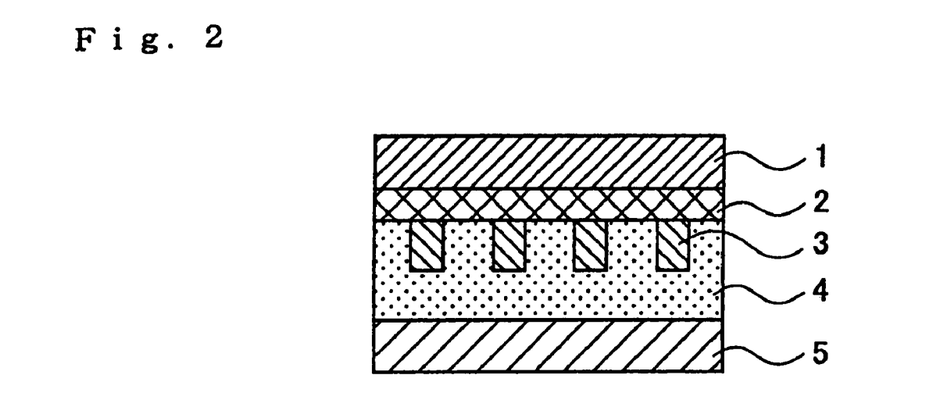
FIG. 2 is a schematic sectional view showing basic construction of the transparent conductive multi-layer structure according to the present invention.

The transparent conductive multi-layer structure of the present invention is manufactured in the following way. As shown in FIG. 2, first, a smooth base material 1 not used to constitute the device is coated thereon with a transparent conductive layer forming coating fluid, followed by drying to form a transparent conductive layer 2, and an auxiliary electrode layer 3 is further formed in a pattern on the transparent conductive layer 2. Onto the transparent conductive layer 2 and pattern-shaped auxiliary electrode layer 3 (on the side opposite to the smooth base material 1) thus formed, a transparent substrate 5 used to constitute the device is laminated through an adhesive layer 4, and thereafter the adhesive layer 4 is cured to join these together.

As basic construction, the transparent conductive multi-layer structure obtained in this way has, as shown in FIG. 2, the smooth base material 1, which is used as a provisional support to form thereon the transparent conductive layer 2, the transparent conductive layer 2 formed on the smooth base material 1 by coating, the pattern-shaped auxiliary electrode layer 3 formed on the transparent conductive layer 2, and the transparent substrate 5 joined to the transparent conductive layer 2 and auxiliary electrode layer 3 through the adhesive layer 4.

Figure 3:
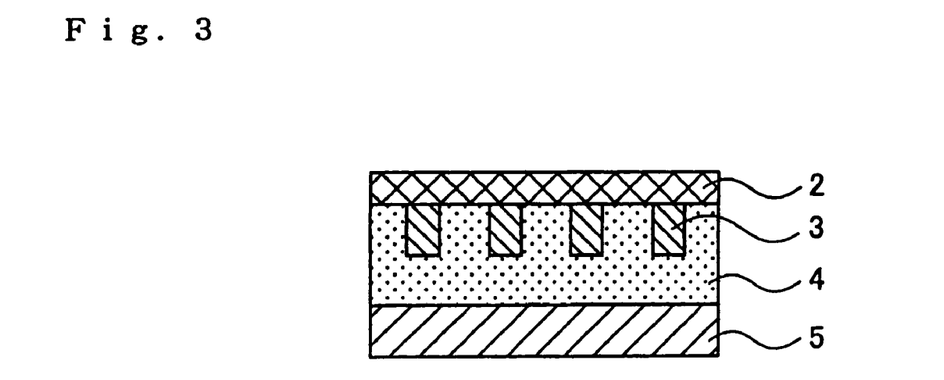
FIG. 3 is a schematic sectional view showing a state in which the smooth base material has been peeled off from the transparent conductive multi-layer structure according to the present invention, shown in FIG. 2.

In the transparent conductive multi-layer structure of the present invention, the smooth base material 1 is peelable from the transparent conductive layer 2 at the interface between them. The peeled-off surface of the transparent conductive layer 2 from which the smooth base material 1 has been peeled off is, as shown in FIG. 3, a very smooth surface which reflects the smooth base material 1. Moreover, the pattern-shaped auxiliary electrode layer 3 is formed beneath the transparent conductive layer 2 (on its side opposite to the peeled-off surface) in order to make the latter have a low film surface resistivity, and hence this enables achievement of both good conductivity and smooth surface (peeled-off surface).

Accordingly, after the smooth base material 1 has been peeled off and removed from this transparent conductive multi-layer structure, various functional thin films can readily be formed or layered on the smooth peeled-off surface of the transparent conductive layer 2 without any restrictions at all, and various devices such as dye-sensitized solar cells and organic EL devices can be fabricated thereon. Also, even where the auxiliary electrode layer 3 is formed in a larger thickness while keeping the pattern shape, in order to more lower the film surface resistivity, the auxiliary electrode layer 3 merely has the larger thickness within the adhesive layer 4, and this by no means affect the smoothness of the transparent conductive layer 2, the transmittance of the transparent conductive multi-layer structure, the characteristics of various devices, and so forth.

Figure 4:
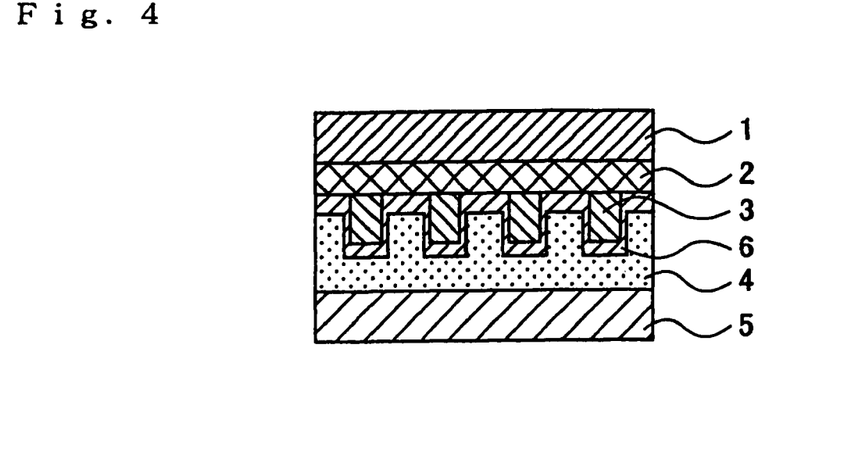
FIG. 4 is a schematic sectional view showing the transparent conductive multi-layer structure according to the present invention, having other construction.

In the transparent conductive multi-layer structure of the present invention, as shown in FIG. 4, a transparent coat layer 6 formed by coating may also be provided between i) the pattern-shaped auxiliary electrode layer 3 and the transparent conductive layer 2 at its areas standing not covered with the pattern-shaped auxiliary electrode layer 3 and ii) the adhesive layer 4. More specifically, in manufacturing the transparent conductive multi-layer structure, after the transparent conductive layer 2 and the auxiliary electrode layer 3 have been formed on the smooth base material 1, the transparent conductive layer 2 at its uncovered areas and the pattern-shaped auxiliary electrode layer 3 are coated thereon with a transparent coat layer forming coating fluid, followed by curing to form the transparent coat layer 6. Thereafter, the transparent substrate 5 may be joined to this transparent coat layer 6 (on its side opposite to the smooth base material 1) through the adhesive layer 4.

As describe above, the transparent conductive layer 2 at its uncovered areas and the pattern-shaped auxiliary electrode layer 3 are coveringly coated with the adhesive or the transparent coat layer forming coating fluid, so that the adhesive components or the binder components in the transparent coat layer forming coating fluid penetrate into gaps between the conductive fine oxide particles themselves of the transparent conductive layer 2 and finally come to cure to fill the gap portions. Hence, the transparent conductive layer 2 can vastly be improved in strength and weatherability. Because of the coating with the adhesive or transparent coat layer forming coating fluid, followed by curing, the adhesive components or the binder components make the conductive fine oxide particles combine mutually strongly, and hence this also bring the effect of making the transparent conductive layer 2 have a vastly low film surface resistivity. For example, where a transparent conductive layer composed of only conductive fine oxide (ITO) particles and having a film surface resistivity of 4,500 Ω/square is coated with an acrylic ultraviolet-curable adhesive, followed by ultraviolet curing, the film surface resistivity lowers to 800 Ω/square.

Figure 5:
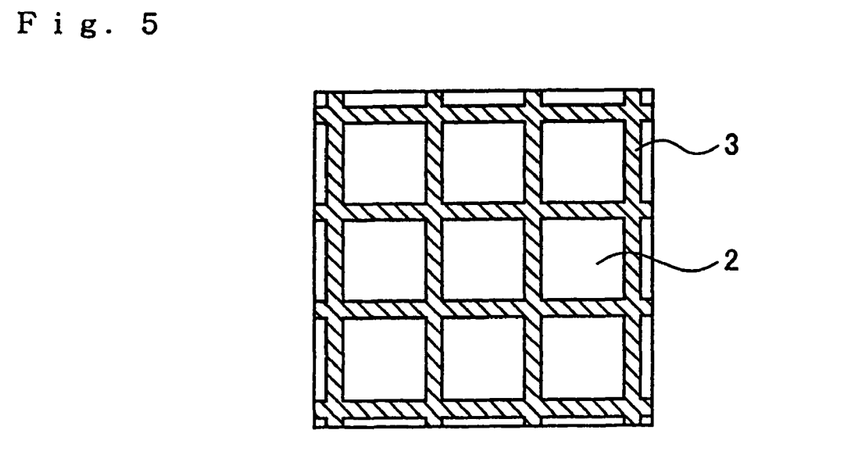
FIG. 5 is a schematic plane view showing an example of a pattern shape of the auxiliary electrode layer according to the present invention.

As to the pattern shape of the auxiliary electrode layer 3, there are no particular limitations thereon as long as it has openings at an appropriate percentage and has the function to lower the film surface resistivity as the auxiliary electrode layer 3. For example, various shapes may be employed, including those conventionally known in the art, such as the shape of a lattice as shown in FIG. 5, and besides the shape of a mesh, the shape of a honeycomb, the shape of parallel lines, the shape of the teeth of a comb, and so forth.

To form the pattern of the auxiliary electrode layer, an auxiliary electrode layer forming paste which contains conductive fine particles may be printed in a pattern by a method such as screen printing; or a metallic layer may be formed over the whole surface of the transparent conductive layer by electrolytic plating or electroless plating, followed by patterning by the use of a method such as photolithography. Of course, pattern printing and plating may be used in combination. However, taking account of simplicity and easiness of processing, the pattern printing of the auxiliary electrode layer forming paste is preferred.

As the auxiliary electrode layer forming paste, a paste may be used which is prepared by dispersing at least one selected from fine metal particles, fine carbon particles and fine ruthenium oxide particles as the conductive fine particles, in a solvent or a solvent containing a binder. This auxiliary electrode layer forming paste may be printed, followed by curing to thereby obtain an auxiliary electrode composed of at least one selected from fine metal particles, fine carbon particles and fine ruthenium oxide particles as the conductive fine particles, or composed of at least one selected from fine metal particles, fine carbon particles and fine ruthenium oxide particles as the conductive fine particles and a binder component.

As materials for the fine metal particles, silver, copper, gold and the like are preferred from the viewpoint of conductivity; and silver, copper, nickel, iron, cobalt and the like, from the viewpoint of cost. Also, platinum, rhodium, ruthenium, palladium and the like are preferred from the viewpoint of corrosion resistance and chemical resistance. The fine carbon particles are inferior to the fine metal particles in respect of conductivity, but are inexpensive and have superior corrosion resistance and chemical resistance. Also, the fine ruthenium oxide ($RuO_2$) particles are more expensive than the fine carbon particles, but serve as a conductive substance having superior corrosion resistance like the fine carbon particles, and hence are usable as a material for the auxiliary electrode.

Figure 6:
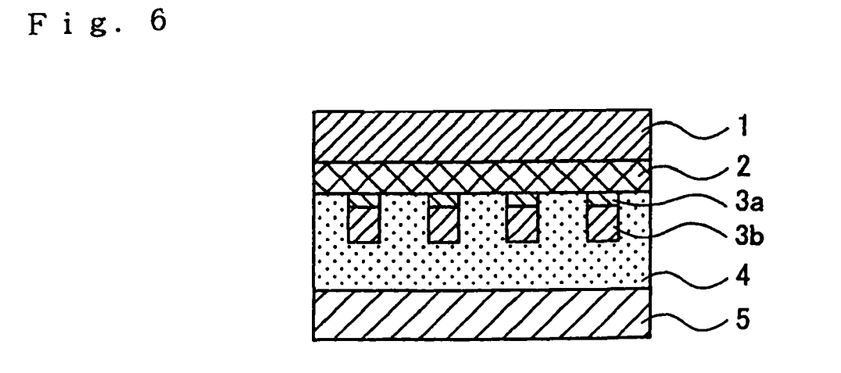
FIG. 6 is a schematic sectional view showing the transparent conductive multi-layer structure according to the present invention, having still other construction.

The pattern-shaped auxiliary electrode layer may also be a multiple layer formed by two or more electrode layers composed of different conductive fine particles. For example, as shown in FIG. 6, a first auxiliary electrode layer 3a composed of at least one selected from fine carbon particles, fine ruthenium particles and fine ruthenium oxide particles and a binder component may be formed on the transparent conductive layer 2, and a second auxiliary electrode layer 3b composed of fine metal (such as silver) particles and a binder component may further multiply be layered thereon. In such a case, the second auxiliary electrode layer 3b constituted of fine metal (such as silver) particles and a binder component, having an inferior corrosion resistance, is protected by the transparent conductive layer 2 and the first auxiliary electrode layer 3a composed of at least one selected from fine carbon particles, fine ruthenium particles and fine ruthenium oxide particles and a binder component, having superior corrosion resistance and chemical resistance. Hence, the transparent conductive multi-layer structure to be obtained can vastly be improved in corrosion resistance.

However, where as shown in FIG. 6 the first auxiliary electrode layer 3a and the second auxiliary electrode layer 3b which have the same pattern shape are formed in an equal line width, there is a possibility that the second auxiliary electrode layer 3b formed later protrudes from the first auxiliary electrode layer 3a formed first, to bring about a risk of damaging the corrosion resistance of the film.

Figure 7:
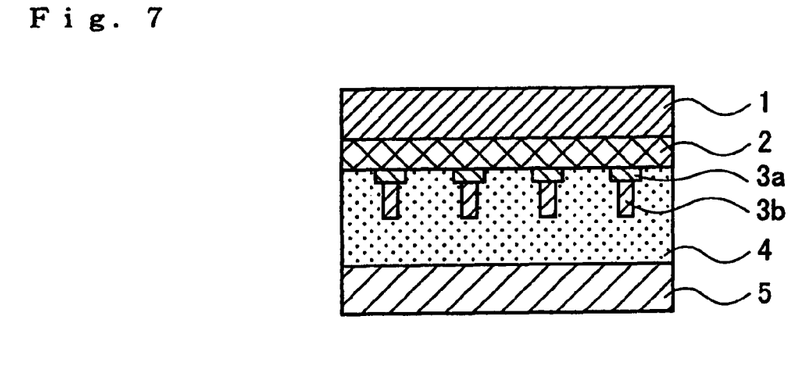
FIG. 7 is a schematic sectional view showing an example of modification of the transparent conductive multi-layer structure according to the present invention, shown in FIG. 6.

Accordingly, as shown in FIG. 7, for example, the line width of the first auxiliary electrode layer 3a constituted of at least one selected from fine carbon particles, fine ruthenium particles and fine ruthenium oxide particles and a binder component may be set larger than the second auxiliary electrode layer 3b constituted of fine metal (such as silver) particles and a binder component. Thus, the second auxiliary electrode layer 3b having an inferior corrosion resistance and constituted of fine metal (such as silver) particles and a binder component can be so formed as not to protrude from the first auxiliary electrode layer 3a constituted of at least one selected from fine carbon particles, fine ruthenium particles and fine ruthenium oxide particles and a binder component. Employment of such construction not only enables solution of the problem of any positional deviation at the part where the auxiliary electrode layer is multiply layered, which depends on accuracy in the step of multiply layering the same, but also brings a more improvement in corrosion resistance and chemical resistance because the first auxiliary electrode layer 3a constituted of at least one selected from fine carbon particles, fine ruthenium particles and fine ruthenium oxide particles and a binder component can more effectively cover and protect the second auxiliary electrode layer 3b constituted of fine metal (such as silver) particles and a binder component.

Incidentally, the transparent conductive layer usually has a layer thickness of from 1 to several µm, and is so structured that the adhesive components or the binder components of the transparent coat layer completely fill the gaps between the conductive fine oxide particles themselves as stated above. Hence, even the transparent conductive layer alone which is so formed as to cover the auxiliary electrode layer has the effect of protecting the auxiliary electrode layer.

The above transparent conductive layer and transparent coat layer may be formed by coating. More specifically, the transparent conductive layer forming coating fluid or the transparent coat layer forming coating fluid may be coated by a method such as spin coating, spray coating, doctor blade coating, roll coating, gravure coating, ink-jet printing or screen printing, optionally followed by drying, and further followed by curing treatment necessary in accordance with the binder contained, e.g., curing treatment such as heating treatment at about 50 to 200° C. or irradiation with ultraviolet rays, to form the respective layers.

As to the transparent conductive layer, rolling may be carried out after the transparent conductive layer forming coating fluid has been coated and then dried. The rolling thus carried out enables the transparent conductive layer to be more improved in conductivity because the conductive fine oxide particles in that layer can be filled in a higher density. As the rolling, a method is available in which, e.g., the smooth base material on which the transparent conductive layer has been formed is rolled by means of steel rolls. In such a case, the rolling by means of steel rolls may preferably be carried out at a pressure of from 29.4 to 490 N/mm (30 to 500 Kgf/cm), and more preferably from 98 to 294 N/mm (100 to 300 Kgf/cm), as linear pressure. This is because, if it is done at a linear pressure of less than 29.4 N/mm (30 Kgf/cm), the effect of improving the resistivity of the transparent conductive layer in virtue of the rolling may be insufficient, and, at a linear pressure of more than 490 N/mm (500 Kgf/cm), the rolling requires large-scale equipment and at the same time the base material plastic film may strain.

The transparent conductive layer forming coating fluid used in the present invention is chiefly composed of a solvent and conductive fine oxide particles standing dispersed in the solvent. As the conductive fine oxide particles, usable are, e.g., fine indium-tin oxide (ITO) particles, fine indium-zinc oxide (IZO) particles, fine indium-tungsten oxide (IWO) particles, fine indium-titanium oxide (ITiO) particles, fine indium-zirconium oxide particles, fine tin-antimony oxide (ATO) particles, fine fluoro-tin oxide (FTO) particles, fine aluminum-zinc oxide (AZO) particles and fine gallium-zinc oxide (GZO) particles, which have both transparency and conductivity. Incidentally, in view of the film surface resistivity, fine ITO particles are preferable because they have a superior conductivity. In view of the weatherability, fine FTO particles are preferable.

The conductive fine oxide particles may preferably have an average particle diameter of from 1 to 100 nm, and more preferably from 10 to 50 nm. This is because, if the conductive fine oxide particles have an average particle diameter of less than 1 nm, the transparent conductive layer forming coating fluid may be prepared with difficulty, and, if they have an average particle diameter of more than 100 nm, it is difficult for the transparent conductive layer to achieve a high transmittance and a low resistivity simultaneously. Incidentally, the average particle diameter of the conductive fine oxide particles shows the value observed on a transmission electron microscope (TEM).

To the transparent conductive layer forming coating fluid, a binder may be added in a small quantity. The use of such a transparent conductive layer forming coating fluid with the binder added thereto enables that layer to be improved in film strength as a sole layer. As the binder, an organic binder and/or an inorganic binder may be used, which may appropriately be selected taking account of the smooth base material to be coated with the transparent conductive layer forming coating fluid, the film forming conditions for the transparent conductive layer, and so forth.

As the organic binder, it may be selected from a thermoplastic resin, a thermosetting resin, a cold-setting resin, an ultraviolet-curable resin, an electron beam curable resin and so forth. For example, the thermoplastic resin may include acrylic resin, PET resin, polyolefin resin, vinyl chloride resin, polyvinyl butyral resin, PVP resin and polyvinyl alcohol resin. The thermosetting resin may include epoxy resin. The cold-setting resin may include two-pack epoxy resin and urethane resin; the ultraviolet-curable resin, various oligomers, monomers and photoinitiator-containing resins; and the electron beam curable resin, various oligomer- or monomer-containing resins. Examples are by no means limited to these resins.

The inorganic binder may include binders composed chiefly of silica sol. The inorganic binder may include fine magnesium fluoride particles, alumina sol, zirconia sol, titania sol, or silica sol modified partly with an organic functional group. As the silica sol, usable are a polymer obtained by adding water or an acid catalyst to an orthoalkyl silicate to effect hydrolysis, and then making dehydropolycondensation proceed; and a polymer obtained using a commercially available alkyl silicate solution the polymerization of which has been made to proceed to form a tetra- to pentamer, and by making its hydrolysis and dehydropolycondensation further proceed.

Incidentally, if the dehydropolycondensation proceeds in excess, the solution may increase in viscosity to finally come to solidify. Hence, as to the degree of dehydropolycondensation, it is so controlled that the viscosity may be not more than the maximum viscosity at which the transparent substrate can be coated with the coating fluid. However, there are no particular limitations on the degree of dehydropolycondensation as long as it is at the level not more than the above maximum viscosity. Taking account of film strength, weatherability and so forth, it may preferably be approximately from 500 to 50,000 in weight-average molecular weight. Then, the resultant alkyl silicate hydrolyzed polymer product (the silica sol) substantially completely undergoes the dehydropolycondensation at the time of heating carried out after the transparent conductive layer forming coating fluid has been coated and dried, to come into a hard silicate film (a film composed chiefly of silicon oxide).

The transparent coat layer forming coating fluid is also constituted of a solvent and a binder. As the binder, it may be the same one as the binder added to the transparent conductive layer forming coating fluid described previously, and the organic binder and/or the inorganic binder may be used. In particular, the ultraviolet-curable resin and the binder composed chiefly of silica sol are preferred as having not so high adhesion to the smooth base material and having superior weatherability and chemical resistance.

As the smooth base material used in the present invention, there are no particular limitations thereon as long as it is peelable from the transparent conductive layer at the interface between them. Stated specifically, usable are glass, plastics such as polyethylene terephthalate (PET), polyethylene naphthalate (PEN) and polyether sulfone (PES), and metals such as stainless steel. In particular, PET film is preferred from the viewpoint of being inexpensive, having a high surface flatness and being so flexible as to be readily peelable.

The peelability or releasability at the interface between the smooth base material and the transparent conductive layer is influenced by the materials for the smooth base material, the components of the transparent conductive layer forming coating fluid and so forth, and further by the type of the adhesive and the components of the transparent coat layer forming coating fluid (because the adhesive and the transparent coat layer forming coating fluid may reach the surface of the smooth base material when they penetrate into the transparent conductive layer). However, as long as the smooth base material is made of glass, plastic or metal and also its surface is a usual smooth surface, it can be in the state of being readily peelable at the interface between it and the transparent conductive layer formed by coating.

Meanwhile, the transparent substrate may appropriately be selected in accordance with the devices to be used. Usable therefor are, e.g., but not limited to, films or sheets of plastics such as acrylate (PMMA), polycarbonate (PC), polyethylene terephthalate (PET), polyethylene naphthalate (PEN) and polyether sulfone (PES), or glass sheets or the like, which are capable of transmitting visible light.

Incidentally, where a plastic film or sheet is used as the transparent substrate in the device such as the organic EL device, which may cause deterioration of devices because of moisture, it is preferable for the plastic film or sheet to be beforehand provided with a moistureproof coating. It is also preferable for the transparent substrate to be beforehand subjected to easy-adhesion treatment which enhances its adhesion to the adhesive layer, stated specifically, primer treatment, plasma treatment, corona discharge treatment, short-wavelength ultraviolet irradiation treatment, silane coupling treatment or the like.

As the adhesive used to join the transparent substrate, there are no limitations at all thereon as long as it can keep the transparent conductive layer and the pattern-shaped auxiliary electrode layer or transparent coat layer adherent to the transparent substrate when at least the smooth base material is peeled off, and furthermore does not adversely affect the peelability or releasability of the smooth base material. Usable therefor are, e.g., acrylic-type, urethane type or epoxy type cold-setting resins, thermosetting resins, ultraviolet-curable resins, electron beam curable resins and so forth.

The adhesive may further contain, besides the above resin, at least one additive selected from an ultraviolet absorber, a dehydrating agent and a deoxidizer. Any of these ultraviolet absorber, dehydrating agent and deoxidizer may be mixed into the adhesive in the form of dissolution in an adhesive solution or dispersion as fine particles. The addition of any of these ultraviolet absorber, dehydrating agent and deoxidizer enables the polymer light-emitting layer and the cathode layer from deteriorating in the organic EL device, and enables the organic dye from deteriorating in the dye-sensitized solar cell as well. For example, the ultraviolet absorber may include organic compounds of a salicylate type, a benzophenone type, a benzotriazole type, a cyanoacrylate type and so forth, as well as inorganic compounds such as zinc oxide, titanium oxide and cerium oxide. The dehydrating agent may include silica gel, zeolite, phosphorus pentoxide, sodium sulfate, calcium oxide and barium oxide and so forth. The deoxidizer may include various metals such as iron, magnesium and calcium, which readily combine with oxygen, or organic-type deoxidizers. Then, as long as these have their own functions, these may have a form of fine particles or may stand dissolved in a molecular form, without limitations thereto. Also, a functional material or functional fine particles other than the foregoing, such as a selective wavelength light absorbent material may optionally be mixed in the adhesive.

The transparent substrate may be laminated with the adhesive layer in the following way: The transparent conductive layer at its uncovered areas, formed on the smooth base material, and the pattern-shaped auxiliary electrode layer are, or the transparent coat layer covering the transparent conductive layer at its uncovered areas and the pattern-shaped auxiliary electrode layer is, coated thereon with the adhesive, or the transparent substrate is, or both the former and the latter are, coated thereon with the adhesive, optionally followed by drying. Thereafter, the lamination is commonly effected applying a linear pressure of approximately from 0.1 to 2.94 N/mm (0.1 to 3 Kgf/cm) by means of steel rolls or rubber rolls. Incidentally, the coating with the adhesive may be carried out by a general-purpose method such as spin coating, spray coating, doctor blade coating, roll coating, gravure coating or screen printing.

After the above lamination has been effected, the adhesive may be cured to complete the joining of the transparent substrate. The adhesive may be cured by heating when a thermosetting resin is used, and by irradiation with ultraviolet rays on the smooth base material side or transparent substrate side when an ultraviolet-curable resin is used. Accordingly, when cured by irradiation with ultraviolet rays, any one of the smooth base material and the transparent substrate must be made of a material capable of transmitting ultraviolet rays.

How to prepare the transparent conductive layer forming coating fluid used in the present invention is described next. First, the conductive fine oxide particles are mixed with a dispersant and a solvent, and thereafter dispersion treatment is carried out. The dispersant may include various coupling agents such as silane coupling agents, various polymeric dispersants, and various surface-active agents of an anionic type, a nonionic type, a cationic type and so forth. These dispersants may appropriately be selected in accordance with the type of the conductive fine oxide particles to be used and the manner of the dispersion treatment. Also, even without use of any dispersant at all, a good state of dispersion can be achieved in some cases, depending on how the combination of the conductive fine oxide particles and the solvent which are to be used is and how the manner of dispersion is. The use of the dispersant involves a possibility of making the film have poor resistivity and weatherability, and hence a transparent conductive layer forming coating fluid making use of no dispersant is most preferred. As the dispersion treatment, it may be carried out by a general-purpose method or means such as ultrasonic treatment, a homogenizer, a paint shaker or a bead mill.

To the resultant conductive fine oxide particle (concentrated) fluid dispersion, the solvent and so forth are added, and then componential adjustment may be made for the adjustment of conductive fine oxide particle concentration, solvent concentration and so forth to obtain a transparent conductive layer forming coating fluid which contains the conductive fine oxide particles. Here, the componential adjustment may preferably be so made that the conductive fine oxide particles in the transparent conductive layer forming coating fluid are in a content of from 1 to 70% by weight and the balance is held by the solvent and other additives. This is because, if the conductive fine oxide particles are in a content of less than 1% by weight, the transparent conductive layer can not be endowed with a sufficient conductivity, and, in a content of more than 70% by weight, it is difficult to prepare the conductive fine oxide particle (concentrated) fluid dispersion. Specific content of the conductive fine oxide particles may appropriately be set within the above range in accordance with the coating method to be used.

As the solvent used in the transparent conductive layer forming coating fluid, there are no particular limitations thereon, and it may appropriately be selected according to the coating method and the film forming conditions. For example, it may include, but is not limited to, water; alcohol type solvents such as methanol (MA), ethanol (EA), 1-propanol (NPA), isopropanol (IPA), butanol, pentanol, benzyl alcohol and diacetone alcohol (DAA); ketone type solvents such as acetone, methyl ethyl ketone (MEK), methyl propyl ketone, methyl isobutyl ketone (MIBK), cyclohexanone and isophorone; glycol derivatives such as ethylene glycol monomethyl ether (MCS), ethylene glycol monoethyl ether (ECS), ethylene glycol isopropyl ether (IPC), propylene glycol methyl ether (PGM), propylene glycol ethyl ether (PE), propylene glycol methyl ether acetate (PGM-AC) and propylene glycol ethyl ether acetate (PE-AC); benzene derivatives such as toluene, xylene, mesitylene and dodecylbenzene; and formamide (FA), N-methylformamide, dimethylformamide (DMF), dimethylacetamide, dimethyl sulfoxide (DMSO), N-methyl-2-pyrrolidone (NMP), ethylene glycol, diethylene glycol, tetrahydrofuran (THF) and chloroform.

The devices making use of the transparent conductive multi-layer structure of the present invention are described next. As described previously, in the transparent conductive multi-layer structure of the present invention, the peeled-off surface of the transparent conductive layer from which the smooth base material has been peeled off is a very smooth surface which reflects the smooth base material, and hence, on the peeled-off surface of the transparent conductive layer, various functional thin films can readily be formed or layered without any restrictions at all, and various devices such as dye-sensitized solar cells and organic EL devices can be fabricated thereon.

Figure 8:
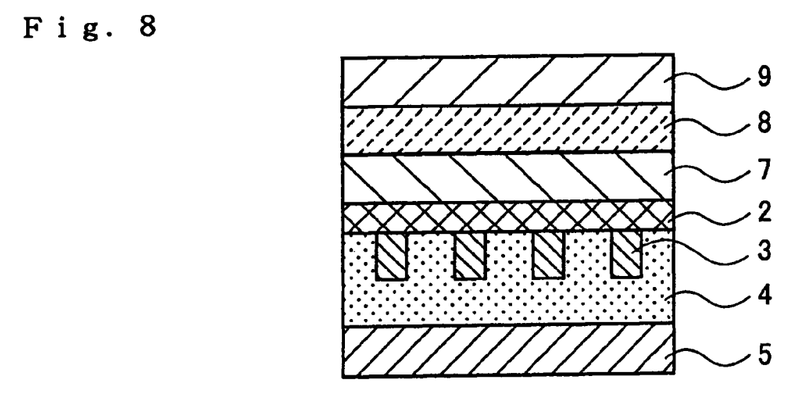
FIG. 8 is a schematic sectional view showing a dye-sensitized solar cell according to the present invention.

For example, the dye-sensitized solar cell, which is one of the devices the present invention provides, may be obtained by, as shown in FIG. 8, forming a dye adsorbed oxide semiconductor electrode layer 7 on the peeled-off surface of the transparent conductive layer 2 after the smooth base material has been peeled off, disposing an opposing electrode 9 in such a way that it stands opposed to the electrode layer 7, and thereafter filling with an electrolyte 8 the part between the dye adsorbed oxide semiconductor electrode layer 7 and the opposing electrode 9. Thus, the dye-sensitized solar cell is basically constituted of the transparent substrate 5, the adhesive layer 4, the pattern-shaped auxiliary electrode layer 3, the transparent conductive layer 2 formed by coating, the dye adsorbed oxide semiconductor electrode layer 7, the electrolyte 8 and the opposing electrode 9.

In this dye-sensitized solar cell, since it has the pattern-shaped auxiliary electrode layer 3, it has a very low film surface resistivity and enables fabrication of a large-area device. Also, since the pattern-shaped auxiliary electrode layer 3 is formed beneath the transparent conductive layer 2, the peeled-off surface of the transparent conductive layer 2 on the opposite side is smooth and has no unevenness or protrusions, and this enables uniform and easy formation of the dye adsorbed oxide semiconductor electrode layer 7. Moreover, since the transparent conductive layer 2 is so structured as to protect the pattern-shaped auxiliary electrode layer 3, the electrolyte 8, though standing adjacent to the transparent conductive layer 2 via the dye adsorbed oxide semiconductor electrode layer 7, which is porous, by no means comes into contact with the auxiliary electrode layer 3. Thus, the auxiliary electrode layer 3 can effectively be kept from undergoing corrosive deterioration.

The dye adsorbed oxide semiconductor electrode layer of the dye-sensitized solar cell may preferably be a porous film constituted of fine or minute particles. The dye adsorbed oxide semiconductor electrode layer may also preferably have a layer thickness in the range of from 0.1 to 20 µm. As its oxide semiconductor, usable are known semiconductor materials such as titanium oxide, zinc oxide, tungsten oxide and barium titanate. In view of stability and safety, titanium oxide is preferred. Incidentally, this oxide semiconductor electrode layer may be formed by a physical film forming process such as sputtering or CVD, or by coating such as a sol-gel process.

The dye adsorbed on the oxide semiconductor electrode layer is a spectral sensitizing dye having absorption in the visible light region and/or the infrared light region, and various metal complexes and organic dyes may be used. In particular, metal complexes are preferred in view of spectral sensitization effect and durability. Such metal complexes may include metal phthalocyanines, and ruthenium (Ru) type complexes such as ruthenium bipyridyl complexes, any of which may be used. Also, in order to make the dye adsorbed on the oxide semiconductor electrode layer, the oxide semiconductor electrode layer may be immersed, at normal temperature or with heating, in a solution prepared by dissolving the dye in an organic solvent. As the organic solvent, it may be any of those capable of dissolving the dye used. Stated specifically, usable are, but no limited to, water, alcohols and the like.

As the opposing electrode, it may be any of those having conductivity and durability to electrolytes, and may include, e.g., but is not limited to, platinum, and conductive materials surface-coated with platinum, as well as rhodium, ruthenium, ruthenium oxide, and carbon.

The electrolyte used in the dye-sensitized solar cell may include, e.g., $I^-/I_3^-$ type, $Br^-/Br_3^-$ type and quinone/hydroquinone type electrolytes. For example, the electrolyte of an $I^-/I_3^-$ type may be obtained by dissolving iodine ($I_2$) and lithium iodide (LiI) or the like in an organic solvent such as ethylene carbonate, propylene carbonate or polyethylene glycol (PEG).

Figure 9:
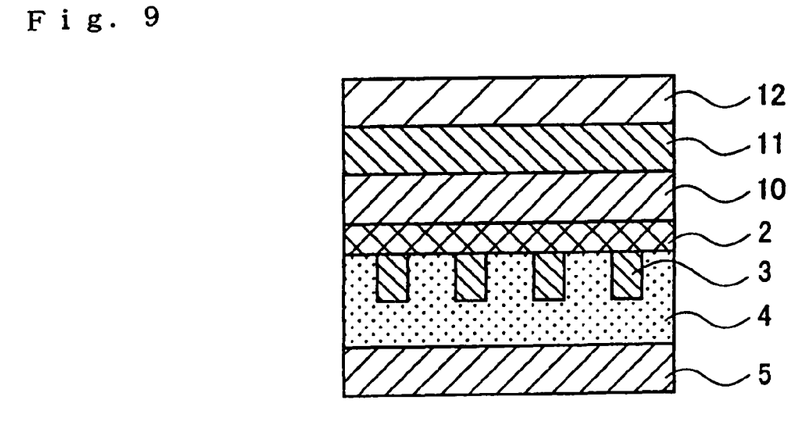
FIG. 9 is a schematic sectional view showing an organic EL device according to the present invention.

The organic EL device, which is another device the present invention provides, may be obtained by, as shown in FIG. 9, forming a hole injection layer 10, a polymer light-emitting (luminescent) layer 11 and a cathode layer 12 in a multiple layer in this order, on the peeled-off surface of the transparent conductive layer 2 after the smooth base material has been peeled off. Thus, the organic EL device is basically constituted of the transparent substrate 5, the adhesive layer 4, the pattern-shaped auxiliary electrode layer 3, the transparent conductive layer 2 formed by coating, the hole injection layer 10, the polymer light-emitting layer 11 and the cathode layer 12.

In the organic EL device of the present invention, since it has the pattern-shaped auxiliary electrode layer 3, it has a very low film surface resistivity and enables fabrication of a large-area device. Also, even where unevenness and protrusions have come about in the transparent conductive layer 2 which are caused by any coating defects such as coarse particles due to agglomeration of the conductive fine oxide particles, coating non-uniformity and foreign matter, these are present on the side of the adhesive layer 4 and the opposite side surface (peeled-off surface) is very smooth. Hence, these do not affect at all the interface between the transparent conductive layer 2 and the hole injection layer 10. Accordingly, this enables, e.g., electrical short circuit (short) to be effectively kept from occurring between these and the cathode layer 12; and insulation breakdown, from occurring in the polymer light-emitting layer 11.

Incidentally, as to the construction of the organic EL device, there may be, e.g., a case in which the hole injection layer 10 is not formed in what is shown in FIG. 9, and besides a case in which a hole transport layer is provided between the hole injection layer 10 and the polymer light-emitting layer 11, or a case in which a hole injection/transport layer serving also as a hole transport layer is used as the hole injection layer 10. An electron transport layer may also be provided between the cathode layer 12 and the polymer light-emitting layer 11. These hole transport layer and electron transport layer thus provided enable well efficient recombination of holes and electrons, which are carriers injected into the polymer light-emitting layer 11. Hence, this can bring a higher light-emitting efficiency.

As a hole injecting substance that constitutes the hole injection layer 10, it may include, e.g., but is not limited to, polyaniline, polythiophene, and derivatives of these as exemplified by a mixture of poly(3,4-ethylenedioxythiophene) and poly(styrenesulfonic acid) (PEDOT/PSS) (trade name: BAYTRON; available from Bayer Japan Ltd.).

As a polymer light-emitting material that constitutes the polymer light-emitting layer 11, it may include, e.g., but is not limited to, metal chelated oxynoid type compounds such as tris(8-quinolinol)aluminum, styrylbenzene type compounds, which are low-molecular light-emitting materials; poly-p-phenylenevinylene (PPV) type, polyphenylene type, polyfluorene type, polyvinyl carbazole type or the like high-molecular compounds, which are high-molecular light-emitting materials; and those obtained by adding to any of these a low-molecular fluorescent coloring matter (e.g., coumarin, perylene, rhodamine, or derivatives of these).

The hole injection layer 10 and the polymer light-emitting layer 11 may be formed by, e.g., a coating method making use of a hole injection layer forming coating fluid and a polymer light-emitting layer forming coating fluid, respectively, or a known method such as vacuum deposition. Incidentally, where the polymer light-emitting layer forming coating fluid makes use of the high-molecular light-emitting material, the polymer light-emitting layer forming coating fluid may only be coated, followed by drying to form the polymer light-emitting layer simply.

As the cathode layer 12, it may preferably be formed of a metal having a low work function, as exemplified by an alkali metal such as lithium (Li), K (potassium) or Na (sodium), an alkaline earth metal such as magnesium (Mg) or calcium (Ca), or aluminum (Al), from the viewpoint of the performance of electron injection into the polymer light-emitting layer 11. Also, taking account of the stability of the cathode layer, the above metal and a metal having a good stability, such as indium (In) or silver (Ag), may preferably be used in combination or in layers.

The cathode layer 12 may be formed by using a known method such as vacuum deposition, sputtering or ion plating. A thin film of about several nanometers (nm) in thickness, composed of lithium fluoride (LiF) or magnesium fluoride ($MgF_2$), may also be sandwiched between the cathode layer 12 and the polymer light-emitting layer 11. Such a structure is also preferable because it can enhance electron injection performance.

Figure 10:
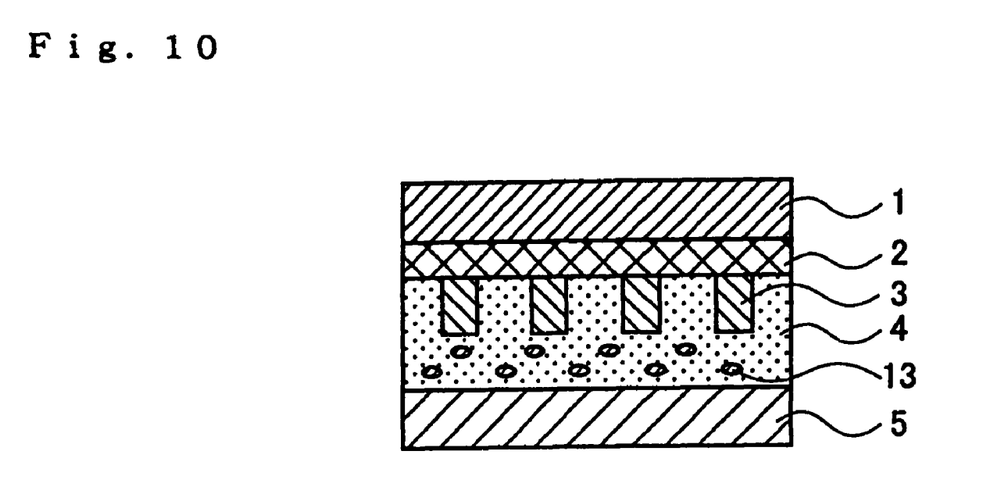
FIG. 10 is a schematic sectional view showing the transparent conductive multi-layer structure according to the present invention, having still other construction.
Figure 11:
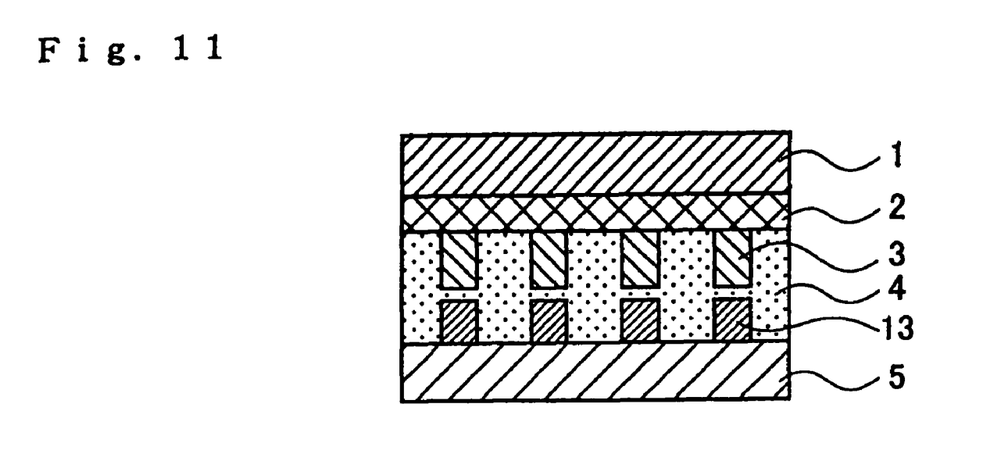
FIG. 11 is a schematic sectional view showing the transparent conductive multi-layer structure according to the present invention, having still other construction.

Now, in the case when at least one additive 13 selected from the ultraviolet absorber, dehydrating agent and deoxidizer stated previously is added to the adhesive layer 4, it may uniformly be mixed as shown in FIG. 10, in the adhesive when this additive 13 is light-transmissive. Even if the additive 13 is opaque, it may be provided as shown in FIG. 11, in the adhesive layer 4 only at its areas facing the pattern-shaped auxiliary electrode layer 3, whereby the visible light transmittance of the transparent conductive multi-layer structure itself can be made not to be damaged.

As described above, in the transparent conductive multi-layer structure of the present invention, the transparent conductive layer formed on the smooth base material by coating and the pattern-shaped auxiliary electrode layer formed on the transparent conductive layer are joined to the transparent substrate through the adhesive layer, and the smooth base material is peelable and removable from the transparent conductive layer. Furthermore, the transparent conductive layer and the auxiliary electrode layer are formed by a low-temperature film formable method, e.g., by coating, and hence this enables use of transparent substrates having a poor heat resistance, such as plastic films.

Thus, since the transparent conductive multi-layer structure exhibits superior conductivity in virtue of the pattern-shaped auxiliary electrode layer and at the same time the peeled-off surface after the peeling and removal of the smooth base material is very smooth, it can be used as a member for devices such as large-area dye-sensitized solar cells and organic EL devices by further forming functional thin films on the peeled-off surface. Also, the transparent conductive multi-layer structure can be stored in the form as it stands, and, in fabricating the devices, the smooth base material may be peeled off and removed immediately before various functional thin films are formed. Hence, there is also an advantage that any foreign matter, dust and so forth can effectively be prevented from adhering to the peeled-off surface used to form the various functional thin films thereon.

In addition, the dye-sensitized solar cell and the organic EL device which are the devices of the present invention have a low film surface resistivity in virtue of the combination of the transparent conductive layer formed by simple coating and the pattern-shaped auxiliary electrode layer. Nevertheless, it does not come about that electrical short circuit occurs between electrodes in the process of fabricating the devices, because each device is so structured that its pattern-shaped auxiliary electrode layer is formed beneath the transparent conductive layer and this transparent conductive layer has a very flat surface (peeled-off surface) and has none of unevenness and protrusions on the side where the device is to be formed. Thus, devices such as dye-sensitized solar cells and organic EL devices which can be of large area can simply be fabricated and can be provided at a low cost.

The present invention is described below in greater detail by giving Examples. The present invention is by no means limited to these Examples. Also, in the following description, "%" refers to "% by weight" except for the percent of transmittance and haze value.

EXAMPLE 1

60 g of fine ITO particles of 0.03 μm in average particle diameter (trade name: SUFP-HX; available from Sumitomo Metal Mining Co., Ltd.) were mixed with 40 g of isophorone serving as a solvent, followed by dispersion treatment to obtain a transparent conductive layer forming coating fluid in which fine ITO particles of 110 nm in average dispersed-particle diameter stood dispersed. Meanwhile, as a smooth base material, PET film (trade name: LUMILAR; available from Toray Industries, Inc.; thickness: 100 μm) was used.

This smooth base material was coated with the transparent conductive layer forming coating fluid by wire bar coating (wire diameter: 0.3 mm), followed by heat treatment at 40° C. for 15 minutes and thereafter at 120° C. for 30 minutes to form on the smooth base material a transparent conductive layer (layer thickness: 3 μm) constituted of fine ITO particles. This transparent conductive layer had film properties of visible light transmittance: 80.3%; haze value: 3.2%; and film surface resistivity: 4,500 Ω/square.

On the transparent conductive layer thus formed, an auxiliary electrode layer forming paste in which fine silver particles stood dispersed in a solvent together with a polyester resin binder (trade name of the paste: FA-401CA; available from Fujikura Kasei Co., Ltd.) was screen-printed (screen: 250 mesh, 0.061 mm in mesh opening) in a lattice (line width: 0.3 mm; line-to-line distance: 2.7 mm), followed by heat treatment at 120° C. for 40 minutes to form a pattern-shaped auxiliary electrode layer (layer thickness: 15 μm).

This transparent conductive layer at its uncovered areas and the pattern-shaped auxiliary electrode layer were coated thereon with an acrylic ultraviolet-curable adhesive (solid content: 100%) by wire bar coating (wire diameter: 0.3 mm), followed by lamination to a primer-treated PET film (trade name: TETORON-HLEW; available from Teijin DuPont Films Japan Limited; thickness: 100 μm) serving as a transparent substrate, and thereafter the adhesive was cured by means of a high-pressure mercury lamp (in the atmosphere, at 140 mW/cm$^2$ for 4 seconds) to obtain a transparent conductive multi-layer structure.

The transparent conductive multi-layer structure according to Example 1, thus obtained, is constituted of the smooth base material, the transparent conductive layer, the pattern-shaped auxiliary electrode layer, the adhesive layer and the transparent substrate. In this transparent conductive multi-layer structure, the PET film as the smooth base material was readily peelable at the interface between it and the transparent conductive layer.

The transparent substrate having thereon the smooth transparent conductive layer and the pattern-shaped auxiliary electrode layer was also obtained by peeling the smooth base material (PET film) off from the transparent conductive multi-layer structure according to Example 1. The transparent conductive layer having this pattern-shaped auxiliary electrode layer had film properties of visible light transmittance: 65.0%; haze value: 2.0%; and film surface resistivity: 0.32 Ω/square. Also, the smooth transparent conductive layer (the peeled-off surface on which the smooth base material was peeled off) had a flatness of Ra: 1.8 nm.

The film surface resistivity of the transparent conductive multi-layer structure is the film surface resistivity of a composite conductive film constituted of the transparent conductive layer and the pattern-shaped auxiliary electrode layer, and it is unclear how the film surface resistivity at the part of the transparent conductive layer has changed through the above series of transfer steps. Accordingly, in order to determine the film surface resistivity at the part of the transparent conductive layer in the transparent conductive multi-layer structure, the above series of transfer steps was repeated except that in that steps the pattern-shaped auxiliary electrode layer was not formed, to obtain a transparent conductive multi-layer structure consisting of the smooth base material, the transparent conductive layer, the adhesive layer and the transparent substrate. The film surface resistivity of the transparent conductive layer as determined in the state the smooth base material was peeled off was 800 Ω/square.

Incidentally, the film surface resistivity was measured with LORESTA AP (MCP-T400), manufactured by Mitsubishi Chemical Corporation. The haze value and the visible light transmittance were measured with a haze meter (hazometer) HR-200, manufactured by Murakami Color Research Laboratory. Also, the transmittance and haze value of the transparent conductive layer are values of only the transparent conductive layer, which are found according to the following calculating expressions 1 and 2.

Transmittance (%) of transparent conductive layer=[(transmittance measured on the whole smooth base material with transparent conductive layer formed thereon)/transmittance of smooth base material]×100.    Calculating expression 1

Haze value (%) of transparent conductive layer=(haze value measured on the whole smooth base material with transparent conductive layer formed thereon)−(haze value of smooth base material).    Calculating expression 2

The transmittance and haze value of the transparent conductive layer having the pattern-shaped auxiliary electrode layer are also values of only the transparent conductive layer having the pattern-shaped auxiliary electrode layer, which are found according to the following calculating expressions 3 and 4.

Transmittance (%) of transparent conductive layer having pattern-shaped auxiliary electrode layer=[(transmittance measured on the whole smooth base material having pattern-shaped auxiliary electrode layer and transparent conductive layer)/transmittance of transparent substrate]×100.    Calculating expression 3

Haze value (%) of transparent conductive layer having pattern-shaped auxiliary electrode layer=(haze value measured on the whole smooth base material having pattern-shaped auxiliary electrode layer and transparent conductive layer)−(haze value of transparent substrate).    Calculating expression 4

Next, using the transparent conductive multi-layer structure according to Example 1, an organic EL device was fabricated in the following way. First, the transparent conductive multi-layer structure was preheated to 40° C., and thereafter the smooth base material (PET film) was peeled off from the transparent conductive multi-layer structure. The peeled-off surface thus obtained was coated thereon with a hole injection layer forming coating fluid by spin coating (150 rpm, for 100 seconds), followed by heat treatment at 120° C. for 10 minutes to form a hole injection layer. The hole injection layer forming coating fluid was prepared by diluting with an organic solvent a fluid dispersion of polyethylenedioxythiophene doped with polystyrenesulfonic acid (PEDOT:PSS) (trade name: BAYTRON P-VP-CH8000; available from Bayer Japan Ltd.). Incidentally, this hole injection layer forming coating fluid was composed of BAYTRON P-VP-CH8000: 20.0%; γ-glycidoxypropyltrimethoxysilane: 1.0%; N-methyl-2-pyrrolidone: 1.5%; propylene glycol methyl ether (PGM): 5.0%; and isopropyl alcohol (IPA): 72.5%.

Further, the transparent substrate having the transparent conductive layer on which the hole injection layer was formed and having the auxiliary electrode layer was preheated to 40° C., and was thereafter coated on the hole injection layer with a polymer light-emitting layer forming coating fluid by spin coating (150 rpm, for 60 seconds), followed by vacuum heat treatment at 80° C. for 60 minutes to form a polymer light-emitting layer. Incidentally, the polymer light-emitting layer forming coating fluid used was composed of poly[2-methoxy-5-(3′,7′-dimethyloctyloxy)-1,4-phenylenevinylene]: 0.25%; and toluene: 99.75%.

On this polymer light-emitting layer, calcium (Ca) and silver (Ag) were vacuum-deposited in this order to form a double-layer cathode layer composed of Ca and Ag (size: 2 cm×2 cm) to obtain an organic EL device according to Example 1. To the organic EL device obtained, a DC voltage of 15 V was applied across the transparent conductive layer (anode layer) and the cathode layer (anode: +; cathode: −). As the result, orange-colored uniform light emission was ascertainable.

EXAMPLE 2

The same smooth base material as that in Example 1 was coated with the same transparent conductive layer forming coating fluid as that in Example 1 by wire bar coating (wire diameter: 0.15 mm), followed by drying at 40° C. for 15 minutes and thereafter at 120° C. for 10 minutes, and thereafter rolling (linear pressure: 147 N/mm=150 kgf/cm; nip width: 1 mm) by means of hard chromium electroplated steel rolls of 150 mm in diameter to form on the smooth base material a transparent conductive layer (layer thickness: 1.8 µm) constituted of densely filled, fine ITO particles. This transparent conductive layer had film properties of visible light transmittance: 90.9%; haze value: 2.1%; and film surface resistivity: 200 Ω/square.

The subsequent procedure in Example 1 was repeated except that the smooth base material was used on which the above transparent conductive layer was formed, to obtain a transparent conductive multi-layer structure.

The transparent conductive multi-layer structure according to Example 2, thus obtained, is constituted of the smooth base material, the transparent conductive layer, the pattern-shaped auxiliary electrode layer, the adhesive layer and the transparent substrate. In this transparent conductive multi-layer structure, the PET film as the smooth base material was readily peelable at the interface between it and the transparent conductive layer.

The transparent substrate having thereon the smooth transparent conductive layer and the pattern-shaped auxiliary electrode layer was also obtained by peeling the smooth base material (PET film) off from the transparent conductive multi-layer structure according to Example 2. The transparent conductive layer having this pattern-shaped auxiliary electrode layer had film properties of visible light transmittance: 73.7%; haze value: 1.1%; and film surface resistivity: 0.32 Ω/square. Also, the smooth transparent conductive layer (the peeled-off surface on which the smooth base material was peeled off) had a flatness of Ra: 1.8 nm.

Then, like Example 1, in order to determine the film surface resistivity at the part of the transparent conductive layer in the transparent conductive multi-layer structure, the series of transfer steps was repeated except that in that steps the pattern-shaped auxiliary electrode layer was not formed, to obtain a transparent conductive multi-layer structure consisting of the smooth base material, the transparent conductive layer, the adhesive layer and the transparent substrate. The film surface resistivity of the transparent conductive layer as determined in the state the smooth base material was peeled off was 150 Ω/square.

Further, the smooth base material (PET film) was peeled off from the transparent conductive multi-layer structure according to Example 2. On the resultant peeled-off surface of the transparent conductive layer, a hole injection layer, a polymer light-emitting layer and a cathode layer were formed in the same manner as in Example 1 to obtain an organic EL device according to Example 2. To the organic EL device obtained, a DC voltage of 15 V was applied across the transparent conductive anode layer and the cathode layer (anode: +; cathode: −). As the result, orange-colored uniform light emission was ascertainable.

EXAMPLE 3

The procedure of Example 1 was repeated to form on the PET film as the smooth base material the transparent conductive layer constituted of fine ITO particles. On this transparent conductive layer, first, an auxiliary electrode layer forming paste in which fine carbon particles stood dispersed in a solvent together with a phenolic-resin binder (trade name of the paste: XC-223; available from Fujikura Kasei Co., Ltd.) was screen-printed (screen: 250 mesh) in a lattice (line width: 0.3 mm; line-to-line distance: 2.7 mm), followed by heat treatment at 90° C. for 5 minutes to form a first pattern-shaped auxiliary electrode layer (layer thickness: 15 μm) composed of fine carbon particles.

Thereafter, on the first pattern-shaped auxiliary electrode layer composed of fine carbon particles, an auxiliary electrode layer forming paste in which fine silver particles stood dispersed in a solvent together with a polyester resin binder (trade name of the paste: FA-401CA; available from Fujikura Kasei Co., Ltd.) was screen-printed (screen: 250 mesh) in a lattice (line width: 0.3 mm; line-to-line distance: 2.7 mm), followed by heat treatment at 120° C. for 40 minutes to form a second pattern-shaped auxiliary electrode layer (layer thickness: 15 μm) composed of fine silver particles.

The resultant transparent conductive layer at its uncovered areas and the first and second multilayered, pattern-shaped auxiliary electrode layer were coated thereon with an acrylic ultraviolet-curable adhesive (solid content: 100%) by wire bar coating (wire diameter: 0.3 mm), followed by lamination to a primer-treated PET film (trade name: TETORON-HLEW; available from Teijin DuPont Films Japan Limited; thickness: 100 μm) serving as a transparent substrate, and thereafter the adhesive was cured by means of a high-pressure mercury lamp (in the atmosphere, at 140 mW/cm² for 4 seconds) to obtain a transparent conductive multi-layer structure.

The transparent conductive multi-layer structure according to Example 3, thus obtained, is constituted of the smooth base material, the transparent conductive layer, the pattern-shaped auxiliary electrode layer (a multiple layer consisting of the first and second auxiliary electrode layers), the adhesive layer and the transparent substrate. In this transparent conductive multi-layer structure, the PET film as the smooth base material was readily peelable at the interface between it and the transparent conductive layer.

The transparent substrate having thereon the smooth transparent conductive layer and the pattern-shaped auxiliary electrode layer was also obtained by peeling the smooth base material (PET film) off from the transparent conductive multi-layer structure according to Example 3. The transparent conductive layer having this pattern-shaped auxiliary electrode layer had film properties of visible light transmittance: 64.8%; haze value: 2.0%; and film surface resistivity: 0.33 Ω/square. Also, the smooth transparent conductive layer (the peeled-off surface on which the smooth base material was peeled off) had a flatness of Ra: 1.8 nm.

Further, the smooth base material (PET film) was peeled off from the transparent conductive multi-layer structure according to Example 3. On the resultant peeled-off surface of the transparent conductive layer, an iodine type electrolytic solution (LiI: 0.5 M; I₂: 0.05 M; balance: polyethylene glycol) for dye-sensitized solar cells was dropped, and this was left at room temperature for 2 hours. Thereafter, the electrolyte resistance (external appearance and film surface resistivity) was examined to find that there was seen no change from what stood before the electrolytic solution was dropped.

EXAMPLE 4

A transparent conductive multi-layer structure was obtained in the same manner as in Example 3 except that the second pattern-shaped auxiliary electrode layer composed of fine silver particles was formed in a two-fold layer thickness (30 μm).

More specifically, the procedure in Example 1 was repeated to form on the PET film as the smooth base material the transparent conductive layer constituted of fine ITO particles, and to form on this transparent conductive layer a first lattice-shaped (line width: 0.3 mm; line-to-line distance: 2.7 mm) auxiliary electrode layer (layer thickness: 15 μm) composed of fine carbon particles.

Thereafter, on the first auxiliary electrode layer composed of fine carbon particles, an auxiliary electrode layer forming paste in which fine silver particles stood dispersed in a solvent together with a polyester resin binder (trade name of the paste: FA-401CA; available from Fujikura Kasei Co., Ltd.) was screen-printed (screen: 250 mesh) in a lattice (line width: 0.3 mm; line-to-line distance: 2.7 mm), which was repeatedly done twice, followed by heat treatment at 120° C. for 40 minutes to form a second pattern-shaped auxiliary electrode layer (layer thickness: 30 μm) composed of fine silver particles.

The resultant transparent conductive layer at its uncovered areas and the first and second multilayered, pattern-shaped auxiliary electrode layer were coated thereon with a transparent coat layer forming coating fluid prepared by so diluting with ethanol an acrylic ultraviolet-curable adhesive (solid content: 100%) as to have a solid content of 50%, by wire bar coating (wire diameter: 0.3 mm), followed by drying at 70° C. for 5 minutes, and thereafter the ultraviolet-curable adhesive was cured by means of a high-pressure mercury lamp (in the atmosphere, at 140 mW/cm² for 4 seconds) to form a transparent coat layer.

This transparent coat layer was further coated thereon with an epoxy type heat-curable adhesive (solid content: 100%) by wire bar coating (wire diameter: 0.3 mm), followed by lamination to a glass substrate (soda-lime glass; thickness: 1 mm) serving as a transparent substrate, and thereafter the adhesive was heat-cured (at 70° C. for 30 minutes, and thereafter at 120° C. for 20 minutes) to obtain a transparent conductive multi-layer structure.

The transparent conductive multi-layer structure according to Example 4, thus obtained, is constituted of the smooth base material, the transparent conductive layer, the pattern-shaped auxiliary electrode layer (a multiple layer consisting of the first and second auxiliary electrode layers), the transparent coat layer, the adhesive layer and the transparent substrate. In this transparent conductive multi-layer structure, the PET film as the smooth base material was readily peelable at the interface between it and the transparent conductive layer.

The transparent substrate having thereon the smooth transparent conductive layer and the pattern-shaped auxiliary electrode layer was also obtained by peeling the smooth base material (PET film) off from the transparent conductive multi-layer structure according to Example 4. The transparent conductive layer having this pattern-shaped auxiliary electrode layer had film properties of visible light transmittance: 64.5%; haze value: 2.0%; and film surface resistivity: 0.16 Ω/square. Also, the smooth transparent conductive layer (the peeled-off surface on which the smooth base material was peeled off) had a flatness of Ra: 1.8 nm.

Further, the smooth base material (PET film) was peeled off from the transparent conductive multi-layer structure according to Example 4. On the resultant peeled-off surface of the transparent conductive layer, an iodine type electrolytic solution (LiI: 0.5 M; $I_2$: 0.05 M; balance: polyethylene glycol) for dye-sensitized solar cells was dropped, and this was left at room temperature for 2 hours. Thereafter, the electrolyte resistance (external appearance and film surface resistivity) was examined to find that there was seen no change from what stood before the electrolytic solution was dropped.

EXAMPLE 5

A transparent conductive multi-layer structure was obtained in the same manner as in Example 1 except that, in Example 1, fine silica gel particles were added to the adhesive as a dehydrating agent.

The transparent conductive multi-layer structure according to Example 5, thus obtained, is constituted of the smooth base material, the transparent conductive layer, the pattern-shaped auxiliary electrode layer, an adhesive layer which contains silica gel, and the transparent substrate. In this transparent conductive multi-layer structure, the PET film as the smooth base material was readily peelable at the interface between it and the transparent conductive layer.

Further, the smooth base material (PET film) was peeled off from the transparent conductive multi-layer structure according to Example 5. On the resultant peeled-off surface of the transparent conductive layer, a hole injection layer, a polymer light-emitting layer and a cathode layer were formed in the same manner as in Example 1 to obtain an organic EL device according to Example 5. To the organic EL device obtained, a DC voltage of 15 V was applied across the transparent conductive anode layer and the cathode layer (anode: +; cathode: −). As the result, orange-colored uniform light emission was ascertainable.

COMPARATIVE EXAMPLE 1

A primer-treated PET film (trade name: TETORON-HLEW; available from Teijin DuPont Films Japan Limited; thickness: 100 µm) serving as a transparent substrate was coated with the transparent conductive layer forming coating fluid of Example 1 by wire bar coating (wire diameter: 0.3 mm), followed by heat treatment at 40° C. for 15 minutes and subsequently at 120° C. for 30 minutes to form on the transparent substrate a transparent conductive layer constituted of fine ITO particles. This transparent conductive layer had film properties of visible light transmittance: 80.2%; haze value: 3.5%; and film surface resistivity: 4,700 Ω/square.

On this transparent conductive layer, first, an auxiliary electrode layer forming paste in which fine carbon particles stood dispersed in a solvent together with a phenolic-resin binder (trade name of the paste: XC-223; available from Fujikura Kasei Co., Ltd.) was screen-printed (screen: 250 mesh) in a lattice (line width: 0.3 mm; line-to-line distance: 2.7 mm), followed by heat treatment at 90° C. for 5 minutes to form a first pattern-shaped auxiliary electrode layer (layer thickness: 15 µm) composed of fine carbon particles.

Thereafter, on this first pattern-shaped auxiliary electrode layer, an auxiliary electrode layer forming paste in which fine silver particles stood dispersed in a solvent together with a polyester resin binder (trade name of the paste: FA-401CA; available from Fujikura Kasei Co., Ltd.) was screen-printed (screen: 250 mesh) in a lattice (line width: 0.3 mm; line-to-line distance: 2.7 mm), followed by heat treatment at 120° C. for 40 minutes to form a second pattern-shaped auxiliary electrode layer (layer thickness: 15 µm) composed of fine silver particles.

Thus, a transparent conductive multi-layer structure according to Comparative Example 1 was obtained, constituted of the pattern-shaped auxiliary electrode layer, the transparent conductive layer and the transparent substrate. In this transparent conductive multi-layer structure according to Comparative Example 1, the transparent conductive layer having the pattern-shaped auxiliary electrode layer had film properties of visible light transmittance: 64.7%; haze value: 3.5%; and film surface resistivity: 0.33 Ω/square. Also, on the surface of the transparent conductive layer, the pattern-shaped auxiliary electrode layer had formed hills of 0.3 mm in width and 30 µm in height and moreover the transparent conductive layer had a flatness of Ra: 12 nm at its areas where this auxiliary electrode layer was not formed.

On the transparent conductive layer on which the auxiliary electrode layer was formed, of the transparent conductive multi-layer structure according to Comparative Example 1, an iodine type electrolytic solution (LiI: 0.5 M; $I_2$: 0.05 M; balance: polyethylene glycol) for dye-sensitized solar cells was dropped, and this was left at room temperature for 2 hours. Thereafter, the electrolyte resistance (external appearance and film surface resistivity) was examined to find that the silver, the main component of the auxiliary electrode layer, stood corroded by the electrolyte to have a film surface resistivity of 220 Ω/square, showing a vastly poor conductivity.

On the transparent conductive layer on which the pattern-shaped auxiliary electrode layer was formed, of the transparent conductive multi-layer structure according to Comparative Example 1, a hole injection layer, a polymer light-emitting layer and a cathode layer were formed in the same manner as in Example 1 to obtain an organic EL device according to Comparative Example 1. To this organic EL device, a DC voltage of 15 V was applied across the transparent conductive layer (anode layer) and the cathode layer (anode: +; cathode: −). As the result, electrical short circuit (short) occurred between the auxiliary electrode layer and the cathode layer, and no light emission took place.

As can be seen from the results in this Comparative Example 1, in the construction of the conventional-type transparent electrode having the transparent conductive layer formed by coating and the pattern-shaped auxiliary electrode layer formed thereon, the auxiliary electrode layer deteriorates because of the electrolyte to come to have a vastly poor film surface resistivity when used in the dye-sensitized solar cell, and also, when used in the organic EL device, the electrical short circuit (short) occurs between the auxiliary electrode layer and the cathode layer to make it very difficult to achieve stable light emission.

On the other hand, in the cases when the transparent conductive multi-layer structures according to Examples 1 to 5 are used, the problem of corrosion of the electrolyte transparent electrode because of the electrolyte does not arise in the dye-sensitized solar cells. Also, in the organic EL devices, the electrical short circuit (short) does not occur, and stable light emission upon application of the DC voltage can be ascertained. It is further seen that, in the transparent conductive multi-layer structure of the present invention, the transparent conductive layer having the pattern-shaped auxiliary electrode layer has a film surface resistivity of as very low as about 0.16 to 0.33 Ω/square, and hence this enables fabrication of large-area dye-sensitized solar cells and organic EL devices.

POSSIBILITY OF INDUSTRIAL APPLICATION

As having been described above, in the case when the transparent conductive multi-layer structure of the present invention is used, a very low film surface resistivity is achievable in virtue of the combination of the transparent conductive layer and the auxiliary electrode layer. Also, the auxiliary electrode layer is positioned between the transparent conductive layer and the transparent substrate, and the surface of the transparent conductive layer on its side where devices are to be formed can be very smooth to have no unevenness or protrusions present thereon. Hence, any electrical short circuit by no means occur between device electrodes. Thus, this is suitable for its use in dye-sensitized solar cells and organic EL devices which have transparent electrode layers having a very low film surface resistivity, can enjoy a low cost and can be of large area.

The invention claimed is:

1. A process for manufacturing a transparent conductive multi-layer structure, which comprises:
   coating a smooth base material thereon with a transparent conductive layer forming coating fluid prepared by dispersing conductive fine oxide particles in a solvent, followed by drying and optionally curing to form a transparent conductive layer; a base material peelable from the transparent conductive layer being used as the smooth base material;
   forming an auxiliary electrode layer in a pattern on the transparent conductive layer;
   coating the auxiliary electrode layer formed and the transparent conductive layer at its areas standing not covered with the auxiliary electrode layer with a transparent coat layer forming coating fluid containing a binder, followed by curing to form a transparent coat layer; and
   joining with an adhesive a transparent substrate to the transparent coat layer.

2. The process for manufacturing a transparent conductive multi-layer structure according to claim 1, wherein, after the coating with said transparent conductive layer forming coating fluid, followed by drying, the transparent conductive layer is subjected to rolling.

3. The process for manufacturing a transparent conductive multi-layer structure according to claim 1, wherein said auxiliary electrode layer is formed by printing a auxiliary electrode layer forming paste prepared by dispersing in a solvent or a solvent containing a binder at least one selected from fine metal particles, fine carbon particles and fine ruthenium oxide particles, followed by curing.

4. The process for manufacturing a transparent conductive multi-layer structure according to claim 1, wherein said conductive fine oxide particles of said transparent conductive layer forming coating fluid has an average particle diameter of from 1 to 100 nm.

5. The process for manufacturing a transparent conductive multi-layer structure according to claim 1, wherein said transparent conductive layer forming coating fluid contains a binder.

6. The process for manufacturing a transparent conductive multi-layer structure according to claim 1, wherein said adhesive is mixed with at least one additive selected from an ultraviolet absorber, a dehydrating agent and a deoxidizer.

* * * * *